United States Patent [19]

Abrokwah et al.

[11] Patent Number: 5,480,829
[45] Date of Patent: Jan. 2, 1996

[54] METHOD OF MAKING A III-V COMPLEMENTARY HETEROSTRUCTURE DEVICE WITH COMPATIBLE NON-GOLD OHMIC CONTACTS

[75] Inventors: Jonathan K. Abrokwah, Tempe; Jenn-Hwa Huang, Gilbert; William J. Ooms, Chandler, all of Ariz.

[73] Assignee: Motorola, Inc., Schaumburg, Ill.

[21] Appl. No.: 83,755

[22] Filed: Jun. 25, 1993

[51] Int. Cl.[6] .................. H01L 21/70; H01L 27/00; H01L 21/44; H01L 21/48
[52] U.S. Cl. .................. 437/57; 437/184; 437/192
[58] Field of Search .................. 437/192, 184, 437/41, 203, 909, 57; 148/DIG. 53, DIG. 72; 257/9, 11, 12, 13, 14, 15, 16, 17, 18, 19, 20, 21, 22, 23, 24, 25, 26, 27, 183, 192, 200, 742, 745, 768, 770

[56] References Cited

U.S. PATENT DOCUMENTS

| | | |
|---|---|---|
| 3,684,930 | 8/1972 | Collins et al. . |
| 4,188,710 | 2/1980 | Davey et al. . |
| 4,313,971 | 2/1982 | Wheatley, Jr. . |
| 4,540,446 | 9/1985 | Nonaka et al. . |
| 4,712,291 | 12/1987 | McLevige . |
| 4,729,000 | 3/1988 | Abrokwah . |
| 4,746,627 | 5/1988 | Zuleeg . |
| 4,814,851 | 3/1989 | Abrokwah et al. . |
| 4,830,980 | 5/1989 | Hsieh . |
| 4,833,042 | 5/1989 | Waldrop et al. . |
| 4,989,065 | 1/1991 | Tsuchimoto et al. . |
| 4,998,158 | 3/1991 | Johnson et al. . |
| 5,045,502 | 9/1991 | Lau et al. . |
| 5,060,031 | 10/1991 | Abrokwah et al. .......... 357/22 |
| 5,091,338 | 2/1992 | Tsuchimoto et al. . |
| 5,093,280 | 3/1992 | Tully . |
| 5,100,835 | 3/1992 | Zheng . |
| 5,116,774 | 5/1992 | Huang et al. . |
| 5,144,410 | 9/1992 | Johnson . |
| 5,275,971 | 1/1994 | Wu et al. . |

FOREIGN PATENT DOCUMENTS

| | | |
|---|---|---|
| 2359640 | 6/1975 | Germany . |
| 62149138 | 12/1985 | Japan . |
| 62149125 | 12/1985 | Japan . |
| 6395620 | 10/1986 | Japan . |

OTHER PUBLICATIONS

R. J. Graham et al., "Investigation of the Structural and Electrical Properties of Al–Ge–Ni Contacts to GaAs," Journal of Electronic Materials, vol. 19, No. 11, 1990, pp. 1257–1263.

C. C. Han et al., "Thermally stable and nonspiking Pd/Sb(Mn) ohmic contact to p–GaAs," Appl. Phys. Lett. 58 (15), 15 Apr. 1991, pp. 1617–1619.

E. Kolawa et al., "Stable Solid–Phase Contact to n–GaAs", IEEE Transactions on Electron Devices, vol. 36 No. 6, Jun. 1989, pp. 1223–1225.

S. Swirhun et al., Third Int. Conf. Indium Phosphide and Related Materials, 8 Apr. 1991, Cardiff, Wales, UK, pp. 238–241 (the whole document).

R. J. Graham et al., Journal of the Electrochemical Society, Jan. 1988, Manchester, N.H., US, vol. 135, No. 1, pp. 266–267 (the whole document).

(List continued on next page.)

Primary Examiner—George Fourson
Assistant Examiner—Brian K. Dutton
Attorney, Agent, or Firm—Aaron B. Bernstein; William E. Koch

[57] ABSTRACT

The present invention encompasses a complementary semiconductor device having the same type of material providing the ohmic contacts (117, 119) to both the N-type and P-type devices. In a preferred embodiment, P-source and P-drain regions (80, 82) are heavily doped with a P-type impurity (81, 83) so that an ohmic with N-type impurity can be used as an ohmic contact. One ohmic material that may be used is nickel-germanium-tungsten. Nickel-germanium-tungsten is etchable, and therefore does not require lift-off processing. Furthermore, a preferred complementary semiconductor device made in accordance with the present invention is compatible with modern aluminum based VLSI interconnection processes.

12 Claims, 4 Drawing Sheets

OTHER PUBLICATIONS

N. Lustig et al., Applied Physics Letters, 13 May 1991, New York, US, vol. 58, No. 19, pp. 2093–2095 (p. 2093).

R. J. Roedel et al., Journal of the Electrochemical Society, May 1993, Manchester, N.H., US, vol. 140, No. 5, pp. 1450–1453 (p. 1450).

IBM Technical Disclosure Bulletin, Jan. 1992, New York, US, vol. 34, No. 8, pp. 470–475 (p. 473).

Hallali et al., Thermally Stable In–Based Ohmic Contacts to P–Type GaAs'–the whole document, Proceedings of the 18th International Symposium on Gallium Arsenide and Related Compounds, Sep., 1991, pp. 179–182.

M. Murakami, Indium Based Ohmic Contacts To n And p–Type GaAs' –the whole document, Extended Abstracts. No. 437, Oct. 1990, p. 638.

D. Davito et al., Ohmic Contacts to p–and n–type GaAs Made with Al–Sn–Ni', Journal of the Electrochemical Society, vol. 140, No. 5, May 1993, pp. 1450–1453.

T. C. Shen et al., Recent Developments in Ohmic Contacts for III–V Compound Semiconductors, Journal of Vacuum Science and Technology: Part B, vol. 10, No. 5, Oct. 1992, pp. 2113–2132.

M. Murakami et al., Thermally Stable, Low–Resistance NiInWNx Ohmic Contacts to N–Type GaAs Prepared By Sputter Deposition, Applied Physics Letters, vol. 59, No. 4, Nov. 1991.

E. Kolawa et al., Solid Phase Ni/Ge Ohmic Contacts to GaAs with W–N Diffusion Barriers, Journal of Electrochemical Society, vol. 133, No. 9, Sep. 1986, the whole document.

METHOD OF MAKING A III-V COMPLEMENTARY HETEROSTRUCTURE DEVICE WITH COMPATIBLE NON-GOLD OHMIC CONTACTS

This application is related to patent application "METHOD OF MAKING OHMIC CONTACTS TO A COMPLEMENTARY SEMICONDUCTOR DEVICE", U.S. patent application Ser. No. 08/083,751, filed by Jonathan K. Abrokwah et al. concurrently with the present application.

BACKGROUND OF THE INVENTION

The present invention relates, in general, to semiconductor devices, and more particularly, to complementary semiconductor devices.

Complementary semiconductor devices, and specifically III-V complementary heterostructure field effect transistors (CHFETs) or complementary heterostructure insulated gate field effect transistors (CHIGFETs) have been shown to be extremely useful for low power, low voltage and high speed applications. See, for example, "Low Power AlGaAs/GaAs Complementary FETs Incorporating InGaAs N-channel Gates," Abrokwah, U.S. Pat. No. 4,729,000 and "High Transconductance Complementary (Al, Ga) As/GaAs Heterostructure Insulated Gate Field-Effect Transistors," Abrokwah et al, U.S. Pat. No. 4,814,851. The prior art discloses complementary gallium arsenide (GaAs) heterostructure devices using self-aligned ion implantation technology. CHIGFETs are CMOS-like devices using a wide bandgap insulator, such as aluminum gallium arsenide (AlGaAs) or aluminum indium arsenide (AlInAs) to confine high mobility two-dimensional electron or hole gases, in the channel, for carrier transport. The two-dimensional gases are formed close to the heterojunction of the wide bandgap material insulator and the narrow bandgap material channel. A typical channel material is pseudomorphic $In_xGa_{1-x}As$. The prior art, however, exhibits several drawbacks with respect to the ohmic contact metallization employed for electrically contacting the active regions of the devices.

The complementary nature of the devices of course implies that they include both N-type and P-type devices on the same substrate. The typical ohmic metallization of the prior art is different for N-type and P-type devices. For N-type, gold germanium nickel (AuGeNi) has been used. For P-type, gold zinc nickel (AuZnNi) or gold zinc gold (AuZnAu) has been used. Both ohmic contacts rely on Au metallization for low resistance, resulting in several disadvantages. The Au-based ohmics are not etchable. Consequently, they must be defined on the device by a lift-off process. As is well understood in the art, lift-off is associated with relatively poor yields and poor pattern definition, and thus limits device geometries to relatively large dimensions. The large dimensions decrease the maximum number of devices which can fit in a given space.

The Au-based ohmics of the prior art also exhibit the disadvantage of being incompatible with modern Al VLSI metallization used for multi-layer integrated circuit interconnections. The incompatibility stems from the fact that the Au-based ohmics fail to provide a stable ohmic contact through the temperature range required for the Al multi-layer technology. Specifically, the typical Al based interconnect processes occur at or above about 500° C. while Au-based ohmics fail to provide stable ohmic contacts above about 470° C. Consequently, the Au-based ohmics of the prior art limit the commercial application of the complementary devices. Furthermore, over time Au tends to react with the Al, creating a problem known as purple plaque which eventually causes failure of the device.

An additional disadvantage of the ohmics of the prior art is that poor contact morphology results from complex reactions of Au with GaAs.

Moreover, a distinct disadvantage results from the prior art ohmic contacts in that two different respective materials are used for the N-type and the P-type devices. As is well understood, the use of separate materials substantially increases the complexity of device processing, which leads to increased costs, increased cycle times, increased safety risks, decreased yields, etc.

Accordingly, what is needed is an ohmic contact suitable for III-V complementary devices which can be used for both N-type and P-type devices, as well as be compatible with modern multi-layer Al VLSI interconnections while avoiding all of the other discussed drawbacks of the prior art. Additionally, it is desirable to have a complementary heterostructure field effect device which employs such an ohmic contact.

SUMMARY OF THE INVENTION

Briefly stated, the scope of the present invention encompasses a III-V complementary semiconductor device employing compatible ohmic contacts. Specifically, a preferred embodiment includes an N-channel device including an N-device gate. The N-channel device includes a first heterostructure insulating region beneath the N-device gate and a first heterostructure channel region beneath the first heterostructure insulating region. Additionally, N-source and N-drain regions are disposed along sides of the N-device gate. The N-source region and N-drain region extend to the first heterostructure channel region. A first ohmic region comprising a first material which provides a substantially stable ohmic contact through the temperature range 500°–600° C. contacts the N-source region, while a similar second ohmic region contacts the N-drain region.

Additionally, the discussed preferred embodiment includes a P-channel device which has a P-device gate. The P-channel device includes a second heterostructure insulating region beneath the P-device gate and a second heterostructure channel region beneath the second heterostructure insulating region. P-source and P-drain regions are disposed along opposing sides of the P-device gate. The P-drain and P-source regions extend to the second heterostructure channel. A third ohmic region comprising the first material contacts the P-source region, while a fourth ohmic region comprising the first material contacts the P-drain region.

Furthermore, the scope of the present invention encompasses a method for making a complementary heterostructure device. A heterostructure channel region is formed. A heterostructure insulator region is formed above the channel region. N-device and P-device gates are formed above the heterostructure insulator region. N-source and N-drain regions are formed along opposing sides of the N-device gate, extending to the channel region. P-source and P-drain regions are formed along opposing sides of the P-device gate, extending to the channel region. First, second, third and fourth ohmic regions formed of a material suitably stable to provide ohmic contacts through the temperature range of 500°–600° C. are formed to contact, respectively, the N-source, N-drain, P-source and P-drain regions. The complementary devices are interconnected with standard VLSI Al interconnect metallization with processes well known in the silicon integrated circuit industry.

DETAILED DESCRIPTION OF THE DRAWINGS

Generally stated, a preferred embodiment of the present invention is a complementary GaAs heterostructure field effect transistor which overcomes the drawbacks of the prior art and establishes a manufacturable device and process compatible with the modern VLSI interconnect technology. This preferred embodiment comprises the same ohmic contact material, nickel-germanium-tungsten (NiGeW), for ohmic contacts for both the N-type devices and the P-type devices.

NiGeW is known to be suitable for contact to N-type regions. It's use as an ohmic contact is shown, for example, in U.S. patent application Ser. No. 08/131,920, now U.S. Pat. No. 5,387,548, continuation of 07/902,244, now abandoned, and U.S. patent application Ser. No. 07/902,245, now U.S. Pat. No. 5,389,564. However, a typical complementary GaAs heterostructure device has an insulating layer comprising a material such as AlGaAs having a high Al concentration. When this insulating layer is P-doped to levels of about $10^{18}$/cc, as in prior art complementary devices, NiGeW would normally be unsuitable. NiGeW contact to such a P-type device is unsuitable because the Ge provides compensating N-type impurities. This is why, for example, the prior art uses AuZnNi or AuZnAu as an ohmic contact to P-type regions where Zn provides a high doping.

Nevertheless, the present invention provides for use of the typically N-type NiGeW ohmic for P-type as well. Specifically, the preferred embodiment uses a high dose co-implant of appropriate implant species to achieve a shallow high doping density in P-type contact regions in order to realize low contact resistance for the P-type devices of the complementary arrangement. The contacts are suitable for AlGaAs/GaAs heterostructures in which the Al content can be as high as required.

The novel and non-obvious ohmic contacts are etchable with techniques such as the one disclosed in co-pending U.S. patent application Ser. No. 07/902,244. Consequently, lift-off techniques are not required. Therefore, higher yields and smaller device geometries are provided.

Furthermore, the preferred devices made in accordance with the present invention are compatible with modern Al based VLSI interconnect techniques. Also, the ohmics of the present invention are mirror smooth, specular and non-spiking. Moreover, substantial advantage over the prior art is provided because the same ohmic material can be used throughout the complementary device. Thus, processing is significantly simplified. The invention can be applied, for example, to digital and analog III-V semiconductors, complementary circuits including FETs, HBTs, and photonic devices such as semiconductor LEDs and lasers. Consequently, there is great application for communication, computing and display applications, etc.

Figure 1:
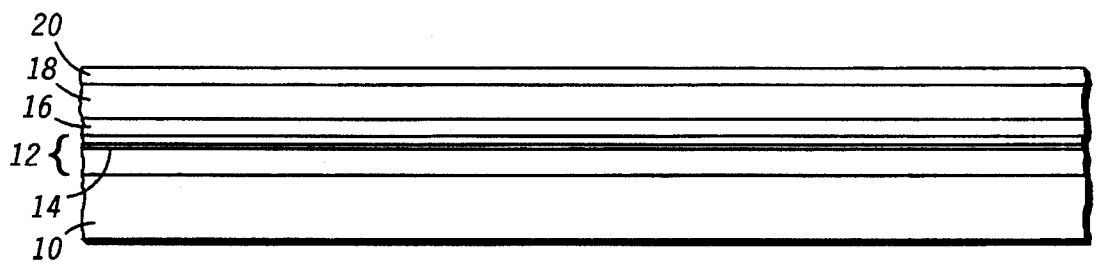
FIG. 1 is a cross-section view of a portion of a substrate of the preferred embodiment of the present invention.

Turning to the drawings, FIG. 1 is a schematic cross-section illustrating the epitaxial semiconductor structure of the preferred embodiment of the present invention. A GaAs substrate 10 is provided. The GaAs substrate 10 is a high resistance material, preferably the type grown by liquid encapsulated Czocrolski (LEC) technique. The GaAs substrate 10 is preferably about 25 mils in thickness, and has a sheet resistance of approximately $10^9$ to $10^{10}$ ohms/sq. An undoped GaAs buffer layer 12 is epitaxially grown, in a manner well known in the art, on the GaAs LEC substrate 10. The GaAs buffer layer 12 is preferably approximately 2,000 Å thick. The GaAs buffer layer 12 is for providing a clean crystal lattice from which to form the active layers of the device. Within the GaAs buffer layer 12, a very narrow delta doping layer 14 is inserted. The delta doping layer 14 preferably comprises silicon (Si), having a carrier concentration of $2-4\times10^{11}$ cm$^{-2}$. In the preferred embodiment, the delta doping layer 14 is disposed approximately 30 Å from the top of the GaAs buffer layer 12. The doping layer 14 functions to provide part of the carriers to the N-channel device and to adjust the threshold voltage of both N-channel and P-channel devices.

An FET channel layer 16 is formed above the GaAs buffer layer 12. The channel layer 16 preferably comprises undoped InGaAs having a mole ratio of 20% In, 80% Ga. In the preferred embodiment, the channel layer 16 is approximately 130 Å thick.

On top of the channel layer 16, an insulating layer 18 is epitaxially grown. Preferably, the insulating layer 18 comprises undoped AlGaAs. The preferred molar ratio is 75% Al, 25% Ga. The layer has a thickness of approximately 250 Å.

An undoped GaAs cap layer 20 is grown above the insulating layer, to a thickness of approximately 30 Å. The GaAs cap layer is for preventing the oxidation of the AlGaAs insulating layer 18.

Thus, the epitaxial semiconductor structure of FIG. 1 provides a heterostructure for forming the preferred complementary heterostructure field effect transistor device. As is apparent, the heterostructure comprises GaAs/InGaAs/AlGaAs.

FIGS. 2–9 illustrate the preferred method of the present invention which results in the preferred complementary heterostructure field effect transistor.

Figure 2:
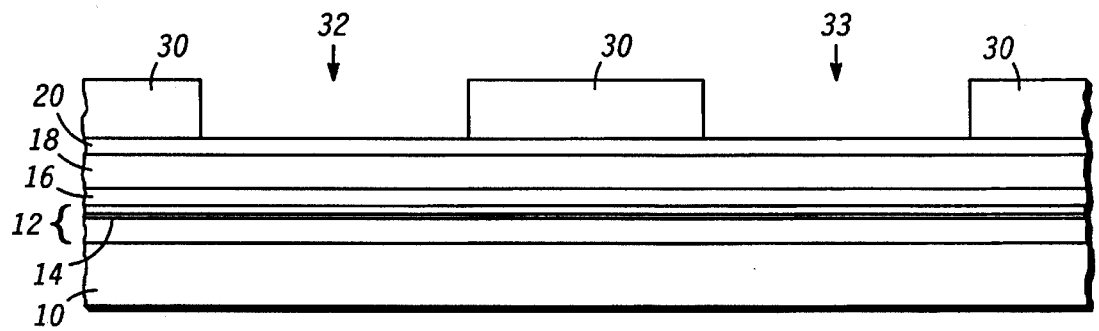
FIG. 2 is a cross-section view illustrating the preferred method of the present invention just after an optional field dielectric is deposited.

Referring to FIG. 2, an optional field dielectric 30 is deposited to protect the substrate material. Windows are opened in the field dielectric 30 with well known lithographic and reactive ion etching (RIE) techniques. The windows provide access to active device regions 32 and 33.

Figure 3:
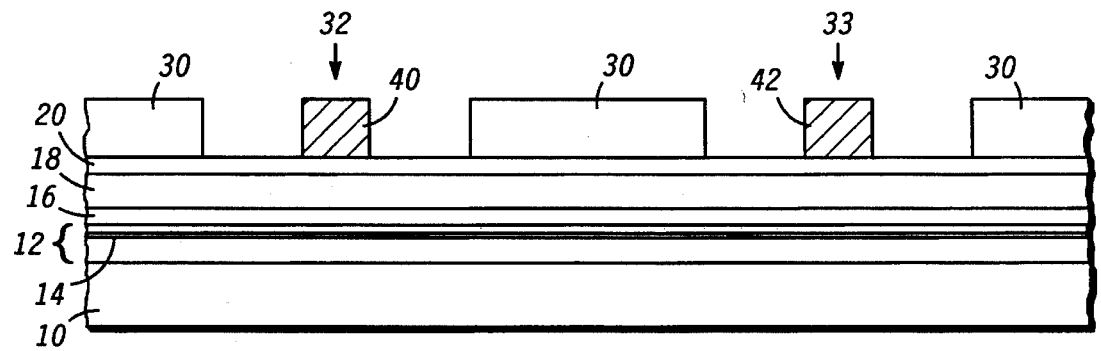
FIG. 3 is a cross-section view illustrating the preferred method of the present invention just after device gates are formed.

Referring to FIG. 3, an N-device gate 40 and a P-device gate 42 are formed in regions 32 and 33, respectively. Specifically, in the preferred embodiment a layer of TiWN of approximately 3,000 to 4,000 Å is reactively RF sputter deposited. The TiWN serves as Schottky contact gates for the field effect devices. Gates 40 and 42 are defined by RIE techniques with a mixture of $SF_6$, $CHF_3$ and He.

Figure 4:
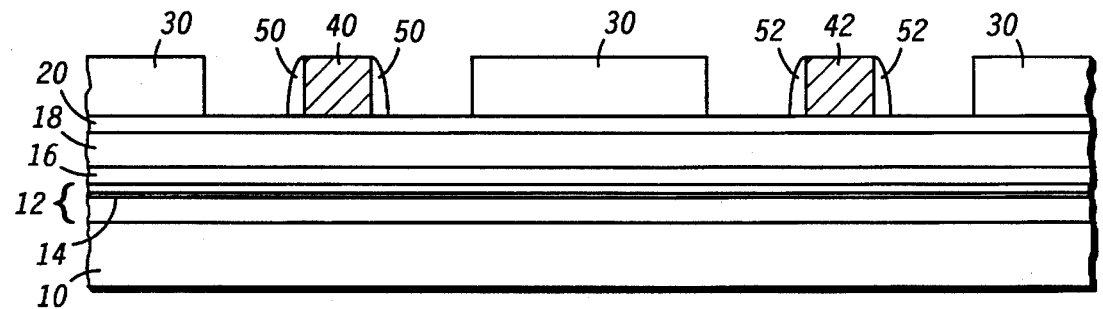
FIG. 4 is a cross-section view illustrating the preferred method of the present invention just after optional gate sidewalls are formed.

FIG. 4 illustrates the forming of pairs of sidewall spacers 50 and 52 on opposing sides of gates 40 and 42, respectively. The sidewalls 50 and 52 are preferable, but not necessary. The sidewalls 50 and 52 function to align the source and drain regions in later steps, so as to enhance performance parameters of the overall device. In the preferred embodiment, the sidewalls 50 and 52 are formed of SiON or $SiN/SiO_2$, with total thickness of approximately 4,000 Å. The sidewalls 50 and 52 are formed with common processing methods. A high pressure anisotropic RIE process is used for etching. The resulting sidewalls 50 and 52 have a footprint alongside the respective gates of approximately 3,000 Å following the RIE.

Figure 5:
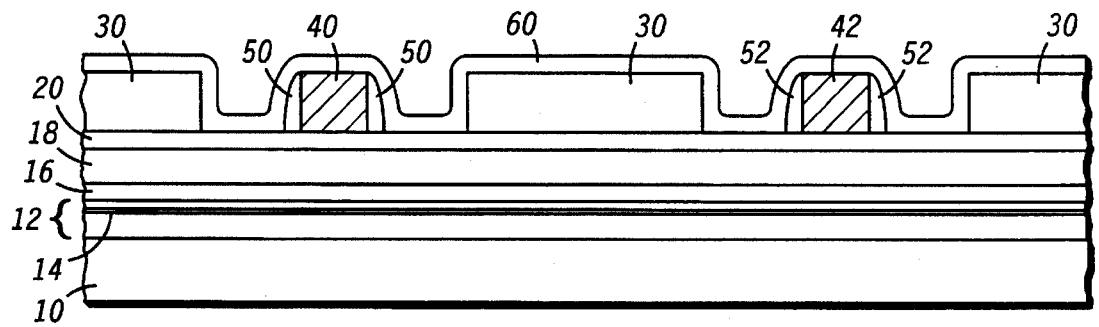
FIG. 5 is a cross-section view illustrating the preferred method of the present invention just after a protective dielectric layer is formed.

FIG. 5 illustrates the deposition of a protective SiN layer 60 covering the field dielectric regions 30, the active device regions 32,33, the gates 40,42, along with the spacers 50,52. The SiN layer 60 functions to protect the wafer surface from the subsequent process steps. The layer 60 is preferably deposited with standard CVD methods to a thickness of approximately 500 Å.

Figure 6:
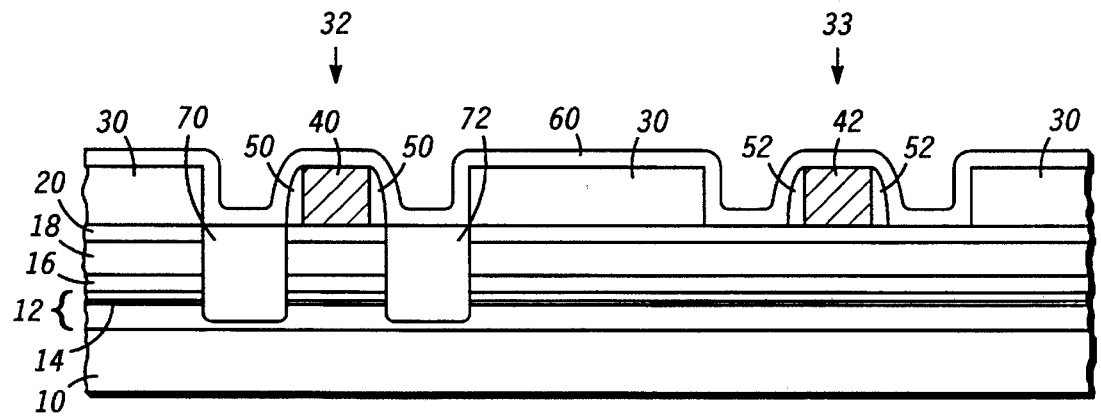
FIG. 6 is a cross-section view illustrating the preferred method of the present invention just after N-source and N-drain regions are formed.

FIG. 6 illustrates the forming of an N-source region 70 and an N-drain region 72 in the active device region 32 adjacent the N-device gate 40. The regions 70 and 72 are formed with well known processing methods using Si implantation to yield a sheet resistance of approximately 350 ohms/sq. The implantation is through the SiN layer 60. N-source region 70 and N-drain region 72 each preferably extend approximately 2,000 Å into the substrate, thus extending at least to the channel layer 16, and preferably into buffer layer 12. Optionally, a lightly doped region may be provided directly self-aligned to the N-device gate 40, with a lower dose Si implant, prior to the sidewall formation, to improve the access series resistance of the N-channel FET.

Figure 7:
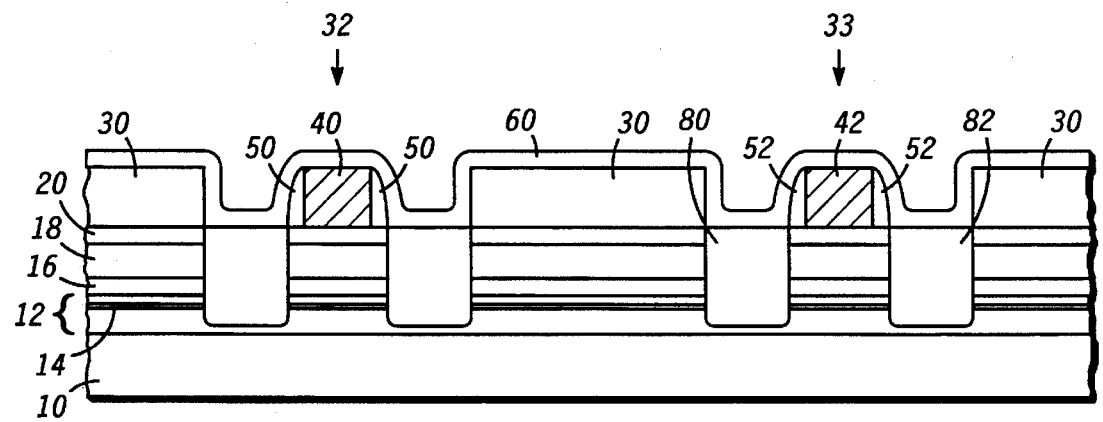
FIG. 7 is a cross-section view illustrating the preferred method of the present invention just after P-source and P-drain regions are formed.

FIG. 7 illustrates the forming of P-source region 80 and P-drain region 82 in the active region 33 adjacent the P-device gate 42. The P-regions 80 and 82 are formed using co-implantation of fluorine (F) and beryllium (Be) to provide a sheet resistance of approximately 1,000–2,000 ohms/sq. P-source region 80 and P-drain region 82 each preferably extend approximately 2,000 Å into the substrate, thus extending at least to the channel layer 16, and preferably into buffer layer 12.

Figure 8:
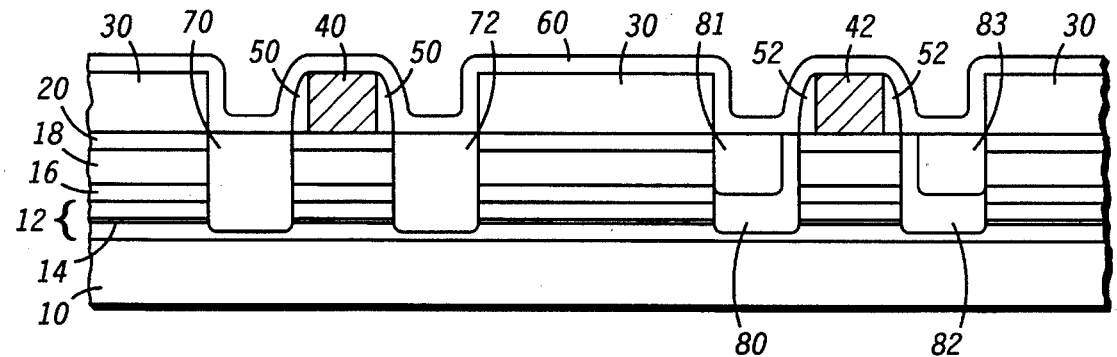
FIG. 8 is a cross-section view illustrating the preferred method of the present invention just after P-source and drain regions are further doped.

FIG. 8 illustrates the further doping of the P-source region 80 and the P-drain region 82 so as to make the regions compatible for the ohmic contact used in the preferred embodiment of the present invention. Specifically, NiGeW is normally only used as N-type ohmic contact metal due to the incorporation of Ge, which is an N-type dopant for GaAs. However, the present invention utilizes NiGeW as the P-type ohmic contact as well. Consequently, in the step illustrated by FIG. 8, the P-type source region 80 and the P-type drain region 82 are further heavily doped so as to provide a shallow and high concentration P-type regions 81 and 82, respectively. A resulting sheet resistivity of 250–400 ohms/square is preferred.

The optimized P-type dopant profile may be achieved using co-implantation of F and Be, As and Be, P and Be, N and Be or Kr and Be. The co-implantation improves the activation of Be and reduces diffusion rate of the Be. In the case of F and Be, peak doping of $5 \times 10^{19}$ $cc^{-1}$ is achieved with implant doses greater than $10^{14}$ $cm^{-2}$ and energies under 50 keV with rapid annealing temperatures, referred to below, of 700°–850° C. Thus, a P-type contact is provided even though an N-type ohmic metal is used.

Although not shown, the next step in the preferred method is a rapid thermal annealing which is used to activate the P and N source and drains. The annealing conditions are preferably temperatures of 700°–850° C. and designed to minimize slip-line generation on large wafers and to reduce P-type HFET sub-threshold currents.

Figure 9:
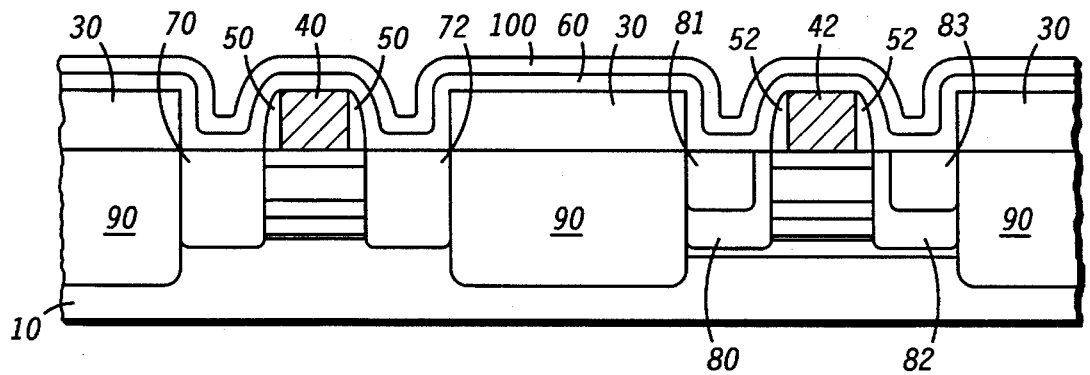
FIG. 9 is a cross-section view illustrating the preferred method of the present invention just after isolation regions are formed.

FIG. 9 illustrates the forming of oxygen isolation (ISO) regions 90 in the epitaxial substrate, between the N-channel device and the P-channel device. The ISO regions 90 functions to electrically isolate the respective devices. It will be understood that the N-device and P-device shown are two of many identical devices formed on a particular die. Consequently, regions 90 are shown at the edges of the figure to indicate isolation from neighboring devices not shown. The ISO uses a rapid thermal annealing which is preferably carried out at 550° C. for six seconds.

FIG. 9 also illustrates an additional dielectric cap 100 covering the whole device. The cap 100 is provided for protection during further processing steps. The dielectric cap 100 is formed using conventional processing methods to a thickness of approximately 3,500 Å.

Figure 10:
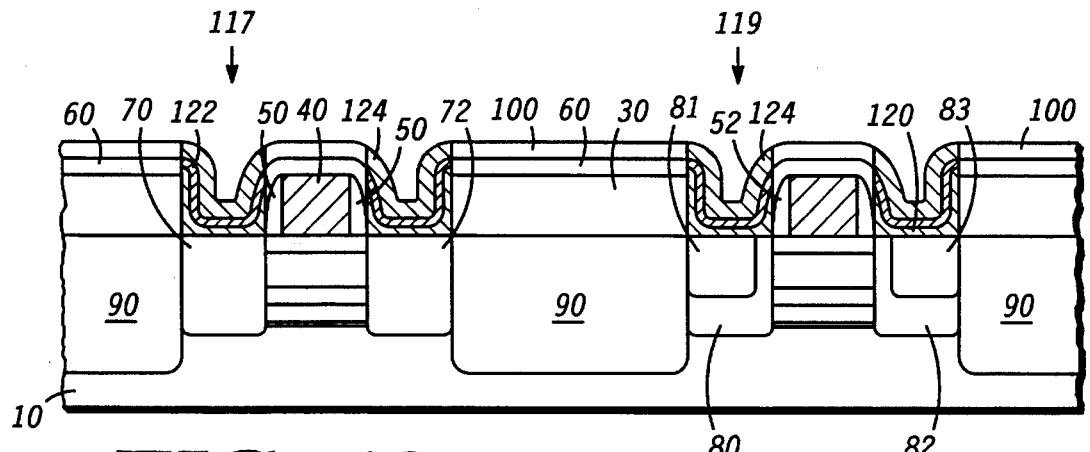
FIG. 10 is a cross-section view illustrating the preferred method of the present invention just after ohmic contacts are formed.

FIG. 10 illustrates the ohmic contacts of the preferred embodiment of the present invention. Although not shown, the dielectric layer 100 and the dielectric layer 60 have been etched-away in areas above the N-source, N-drain, P-source and P-drain regions 70, 72, 80 and 82 to provide access for deposition of the ohmic contacts. Ni layer 120, Ge layer 122 and W layer 124 are sputter deposited over the whole device, and the contact areas are defined. For ease of description, the ohmic contact to N-source region 70 will be referred to as ohmic region 117. Similarly, the contact to P-source region 80 will be referred to as ohmic region 119. These exemplify all the ohmic contacts.

Exemplary ohmic regions 117 and 119 are formed as follows. In an embodiment employing lift-off techniques to define the contact regions, thin layers are required for the metals. In this case, Ni layer 120 is 100–300 Å and Ge layer 122 is 100–300 Å. Finally, W layer 124 is deposited to a thickness of approximately 1,000 Å.

Note that employing etching to define contact regions is also desirable. Any reasonable W thickness can be used when the contacts are defined with etching techniques, such as RIE of the W and Ge and well known chemicals such as buffered oxide etchant (BOE) or hydrochloric acid (HCl) for the nickel. Acceptable techniques are disclosed in co-pending U.S. patent application Ser. No. 07/902,244, although others may be employed.

For the N-channel regions, the ohmic contact material works suitably for the Si doped N-type source and drain regions, so long as the sheet resistivity is less than 1,000 ohms/sq. The ohmic contacts are sputter deposited on the implanted and annealed semiconductor after initial pre-cleaning using wet etching with BOE and HCl.

When sintered in the temperature range 500° C. to 600° C. stable NiGe and NiAs compounds form an interface of the ohmic metal and the semiconductor material. The NiAs compound may form at lower temperatures and may be interspersed in the NiGe matrix. Both these compounds form low barriers to the semiconductor allowing tunneling conduction.

In order to use the NiGeW ohmic contacts for P-type devices, a high concentration of P-type doping is provided in the P-type III-V heterostructure by shallow ion implantation process, as described above with reference to FIG. 8. This ensures that the NiGeW metal contacts a highly doped P-type region despite diffusion of the N-type Ge dopants into the semiconductor.

The W layer 124, which is a refractory metal, may optionally be a different stable refractory metal such as WN, TiW, or TiWN. The refractory cap provides a barrier to As diffusion into Al metallization which may be employed in VLSI interconnection as discussed previously.

Figure 11:
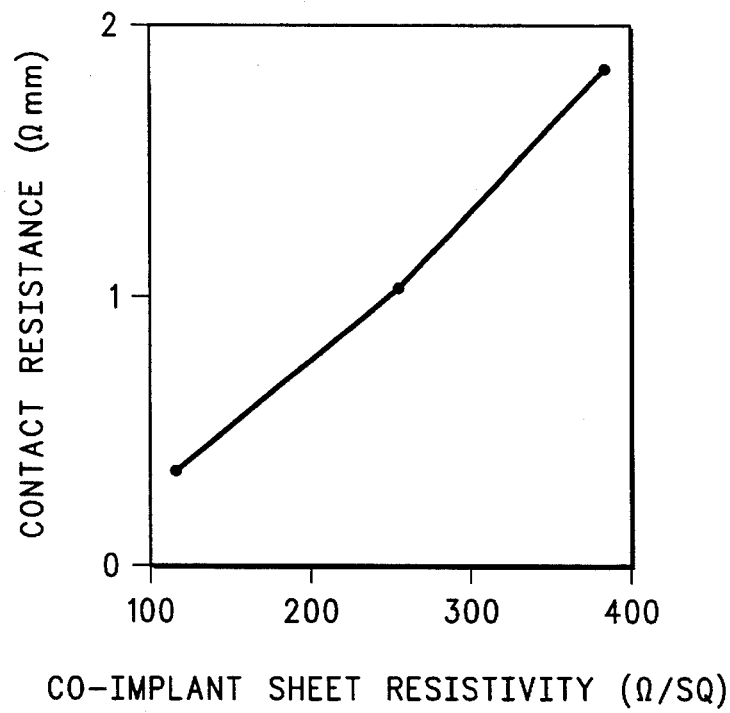
FIG. 11 is a graphical representation illustrating typical ohmic contact resistance versus P-region sheet resistivity.

FIG. 11 illustrates typical contact resistance of NiGeW ohmics on P-type $Al_{0.75}Ga_{0.25}As/In_{0.20}Ga_{0.80}As$ structures. The resistance is plotted versus sheet resistivity of the co-implanted F/Be P-regions 81 and 83. Contact resistance values ranging from 0.22–0.85 ohm-mm may be achieved by changing the surface concentration of the P-type doping. Consequently, it can be seen that, in accordance with the present invention, the same NiGeW ohmic contact, formerly only used for N-type contacts, can be employed usefully in a complementary III-V device which requires P-contacts as well.

Figure 12:
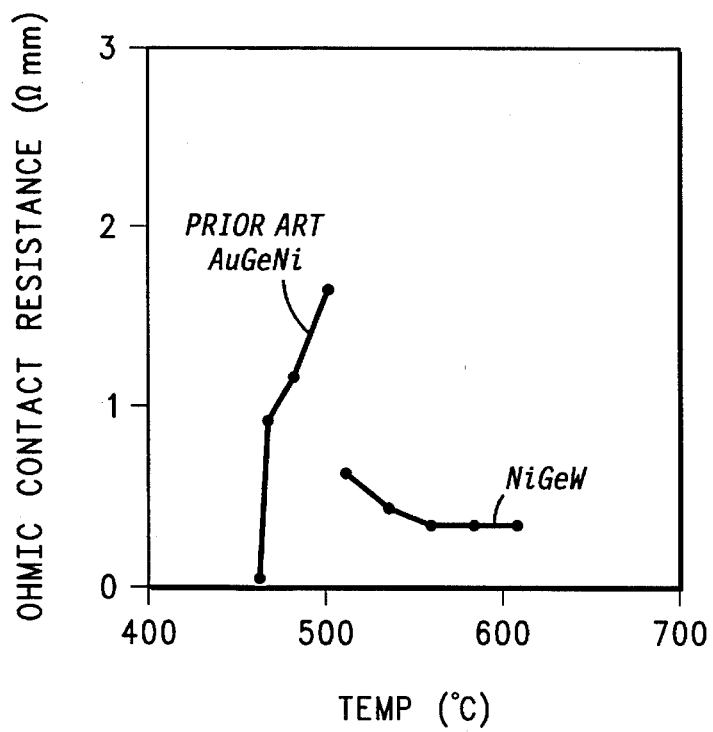
FIG. 12 is a graphical representation illustrating ohmic contact resistance as a function of temperature, comparing the prior art ohmic contact with the preferred ohmic contact.

FIG. 12 illustrates the temperature advantages of the ohmic contacts in accordance with the present invention. The graph illustrates that NiGeW ohmics maintain their useful ohmic contact resistance within a temperature range of 500°–600° C. while the prior art Au based ohmic begins to rapidly degrade well below 500° C. Modern Al VLSI interconnect processes are conducted at a temperature of 500° C. or higher. Therefore, the prior art Au ohmics cannot be used, whereas the ohmics according to the present invention can be used.

By now it should be appreciated that there has been provided a novel and non-obvious complementary semiconductor device and method for making the same. The device is particularly advantageous for use with modern VLSI aluminum interconnection techniques. Additionally, providing the same type ohmic contact for N as well as P devices greatly simplifies processing.

We claim:

1. A method for making a III-V complementary heterostructure device with compatible non-gold ohmic contacts, comprising the steps of:

forming a heterostructure channel region;

forming a heterostructure insulator region above the heterostructure channel region;

forming an N-device gate and a P-device gate above the heterostructure insulator region;

forming an N-source region along a first side of the N-device gate, the N-source region extending to the heterostructure channel region;

forming an N-drain region along a second side of the N-device gate, the N-drain region extending to the heterostructure channel region;

forming a P-source region along a first side of the P-device gate, the P-source region extending to the heterostructure channel region;

forming a P-drain region along a second side of the P-device gate, the P-drain region extending to the heterostructure channel region; and forming first, second, third and fourth ohmic regions contacting the N-source, N-drain, P-source, and P-drain regions, respectively, the ohmic regions being formed of a first material comprising nickel, germanium, and tungsten.

2. The method of claim 1, further comprising the step of providing an etchable material as the first material.

3. The method of claim 1, further comprising the steps of implanting the P-source region and implanting the P-drain region.

4. The method of claim 1, wherein the step of forming the P-source region comprises the step of doping the P-source region with beryllium and at least one of fluorine, arsenic, phosphorus, nitrogen, and krypton, and wherein the step of forming the P-drain region comprises the step of doping the P-drain region with beryllium and at least one of fluorine, arsenic, phosphorus, nitrogen, and krypton.

5. The method of claim 1, further comprising the step of forming the first, second, third and fourth ohmic regions simultaneously.

6. The method of claim 1, further comprising the step of forming sidewalls on opposing sides of the N-device gate and the P-device gate prior to forming the N-source, N-drain, P-source and P-drain.

7. The method of claim 1, further comprising the steps of forming a doped N region aligned to the N-device gate and forming a doped P region aligned to the P-device gate.

8. A method for making a III-V complementary heterostructure device with compatible non-gold ohmic contacts, comprising the steps of:

forming a complementary field effect device comprising an N-type device having an N doped region Legion contacting said ohmic contacts and a P-type device having a P doped region contacting said ohmic contacts; and providing said ohmic contacts comprising nickel, germanium, and tungsten for the N-type device and for the P-type device.

9. The method of claim 8, the step of forming a complementary field effect device further comprising implanting a P-source region and a P-drain region with beryllium and at least one of fluorine, arsenic, phosphorus, nitrogen, and krypton.

10. The method of claim 8, further comprising defining the ohmic contacts by etching.

11. A method for making a complementary III-V heterostructure semiconductor device, comprising the steps of:

forming the complementary semiconductor device comprising an N-type device having an N region and a P-type device having a P region; and providing ohmic contacts comprising nickel, germanium and tungsten for said P region and for said N region.

12. The method of claim 11 further comprising the step of:

implanting the P region and the N region with beryllium and at least one of fluorine, arsenic, phosphorus, nitrogen, and krypton.

* * * * *

UNITED STATES PATENT AND TRADEMARK OFFICE
CERTIFICATE OF CORRECTION

PATENT NO. : 5,480,829
DATED : January 2, 1996
INVENTOR(S) : Jonathan K. Abrokwah
Jenn-Hwa Huang
William J. Ooms It is certified that error appears in the above-indentified patent and that said Letters Patent is hereby corrected as shown below:

Claim 8, column 8, line 41
Delete "Legion".

Signed and Sealed this

Fourth Day of November, 1997

Attest:

BRUCE LEHMAN

*Attesting Officer*     *Commissioner of Patents and Trademarks*